United States Patent

Akiyama

[15] 3,665,263

[45] May 23, 1972

[54] IMPROVEMENTS IN AIR-ISOLATED INTEGRATED CIRCUIT DEVICES TO FACILITATE THE CONNECTION THEREOF TO CIRCUIT BOARDS

[72] Inventor: Katsuhiko Akiyama, 1311-2 Hase, Atsugi, Japan

[22] Filed: June 5, 1970

[21] Appl. No.: 43,667

Related U.S. Application Data

[63] Continuation-in-part of Ser. No. 747,360, July 24, 1968, abandoned.

[52] U.S. Cl. .....................317/235 R, 317/235 F, 317/235 D, 317/234 N, 317/234 M, 317/235 AJ

[51] Int. Cl. .....................H01l 19/00

[58] Field of Search ..........317/235 F, 235 D, 235 AJ, 234 N, 317/234 M

[56] References Cited

UNITED STATES PATENTS 3,396,312 8/1968 Cunningham..........................317/101

3,426,252 2/1969 Lepselter..............................317/234

*Primary Examiner*—John W. Huckert
*Assistant Examiner*—Martin H. Edlow
*Attorney*—Lewis H. Eslinger, Alvin Sinderbrand and Curtis, Morris and Safford

[57] ABSTRACT

An integrated circuit device has a frame of semiconductor material and blocks of the same semiconductor material situated in a space or spaces substantially enclosed by the frame, with the blocks being spaced from the frame and having circuit elements therein which are interconnected by beam leads also functioning as the sole means mechanically coupling or locating the blocks relative to the frame. Certain of the beam leads project beyond the periphery of the frame and all of the beam leads are substantially coplanar and constitute the highest elevations on the circuit device so that the projecting beam leads can be conveniently bonded to conductive areas on a substrate, such as a circuit board, defining external circuits.

7 Claims, 10 Drawing Figures

Patented May 23, 1972 3,665,263

3 Sheets-Sheet 1

KATSUHIKO AKIYAMA

ATTORNEYS

KATSUHIKO AKIYAMA

BY

ATTORNEYS

INVENTOR
KATSUHIKO AKIYAMA
BY [signature]
ATTORNEY

IMPROVEMENTS IN AIR-ISOLATED INTEGRATED CIRCUIT DEVICES TO FACILITATE THE CONNECTION THEREOF TO CIRCUIT BOARDS

This invention relates to an integrated circuit device and more particularly to an integrated circuit device which can be handled and transported without the likelihood of damage thereto. This application is a continuation-in-part of my copending application Ser. No. 747,360, aban. June 27, 1970 filed July 24, 1968.

In integrated circuit devices, a plurality of circuit elements are formed on a common semiconductor substrate and electrically interconnected in predetermined patterns, in which case the isolation of the circuit elements desired to be insulated from adjacent ones is usually effected by one or the other of two methods commonly referred to as junction isolation and air isolation. The junction isolation method involves the provision of P-N junction between the circuit elements and the application of a backward voltage to the P-N junction to thereby electrically isolate the circuit elements, while the air isolation method involves removal of the semiconductor portion between the circuit elements to form a void or space therebetween by which mechanical isolation thereof is provided.

However, with the junction isolation method it is necessary to select the voltage relationships of the entire integrated circuit so as to permit the application of the backward voltage to the P-N junction for the insulation from each other of the desired circuit elements. Further, with this method there is a great possibility of the P-N junction becoming defective during or after the manufacturing operations. Such defect may be the breakage of the P-N junction and further the capacitance present in the P-N junction is likely to cause short-circuiting between the circuit elements when the integrated circuit device is used at high frequencies.

On the other hand, the air isolation method presents a problem in fabrication, particularly by reason of the relatively low mechanical strength of the so-called beam leads for interconnecting circuit elements of the integrated circuit device. This requires much skill and care in handling of the device and hence decreases the efficiency with which the steps of manufacturing components employing the integrated circuit devices can be performed.

It has been proposed, for example, in U.S. Pat. No. 3,396,312, to provide an air-isolated integrated circuit device from a body of semi-conductor material which is etched away to form a moat separating the body into parts constituting a frame enclosing a space or spaces and a block or blocks situated in such space or spaces in spaced relation to the frame for air-isolation of the circuit elements formed in the separated parts of the body and interconnected by metallized contact regions extending across the moat. However, it was not appreciated that the beam leads substituted for the metallized contact regions, without being overly thick, could alone provide the necessary mechanical support for the block or blocks within the frame and, therefore, the above referred to integrated circuit devices further comprise a relatively thick reinforcing layer of non-conductive material, such as hardened photoresist material, applied selectively over the metallized contact regions to span the moat and thereby compensate for the loss of strength of the body of semiconductor material resulting from the etching of the moat. Thus, the reinforcing layer extends substantially above the contact regions and it is necessary to attach wire leads to the contact regions for connection to external circuits. Such attachment to external circuits by way of the wire leads is a painstaking and costly operation.

Accordingly, it is an object of this invention to provide integrated circuit devices which are free of the above mentioned disadvantages of previously existing devices.

More specifically, it is an object of this invention to provide integrated circuit devices employing air isolation for insulating of the circuit elements and which can be safely handled without undue care and conveniently connected to external circuits, for example, by conventional bonding techniques.

According to an aspect of the invention, an integrated circuit device has its circuit elements formed in a plurality of members of the same semiconductor material and at least one of which is in the form of a frame defining a space or spaces substantially enclosed by the frame, whereas the remainder of such members are in the form of a block or blocks situated in each space of the frame and spaced from the latter and from each other for air isolation of the respective circuit elements which are interconnected by beam leads serving also as the sole means to mechanically couple and locate the blocks with respect to the surrounding frame. Such frame is of sufficient mechanical strength to permit the grasping of the integrated circuit device thereat without damage to such device. The beam leads which interconnect the circuit elements and support the blocks of semiconductor material from the frame of the same material, or additional beam leads provided on the frame, project beyong the periphery of the frame and are adapted for connection or bonding to external circuits which may be defined by conductive areas on a substrate.

The above, and other objects, features and advantages of the invention, will be apparent from the following detailed description of illustrative embodiments which is to be read in connection with the accompanying drawings, wherein.

Figure 2:
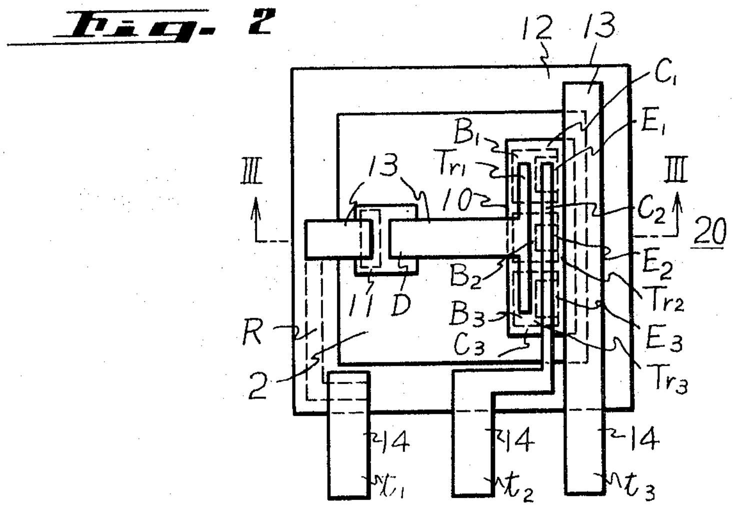
FIG. 2 is an enlarged, schematic plan view of an integrated circuit device according to a first embodiment of this invention.
Figures 3, 4:
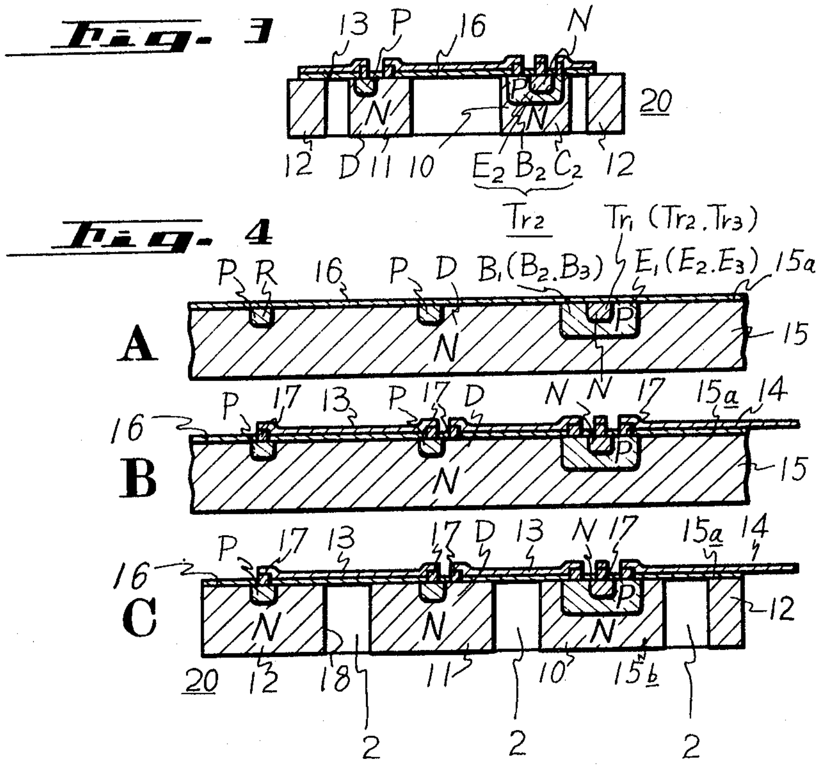
FIG. 3 is a sectional view taken on the line III—III of FIG. 2.
Figure 5:
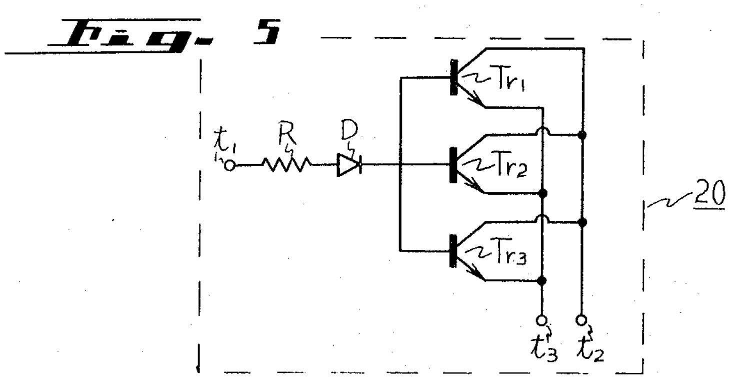
Figure 6:
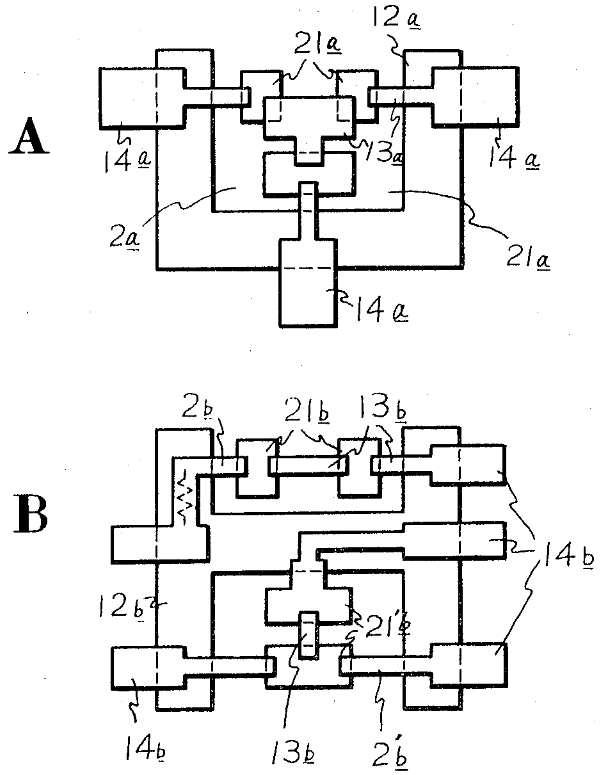
Figure 7:
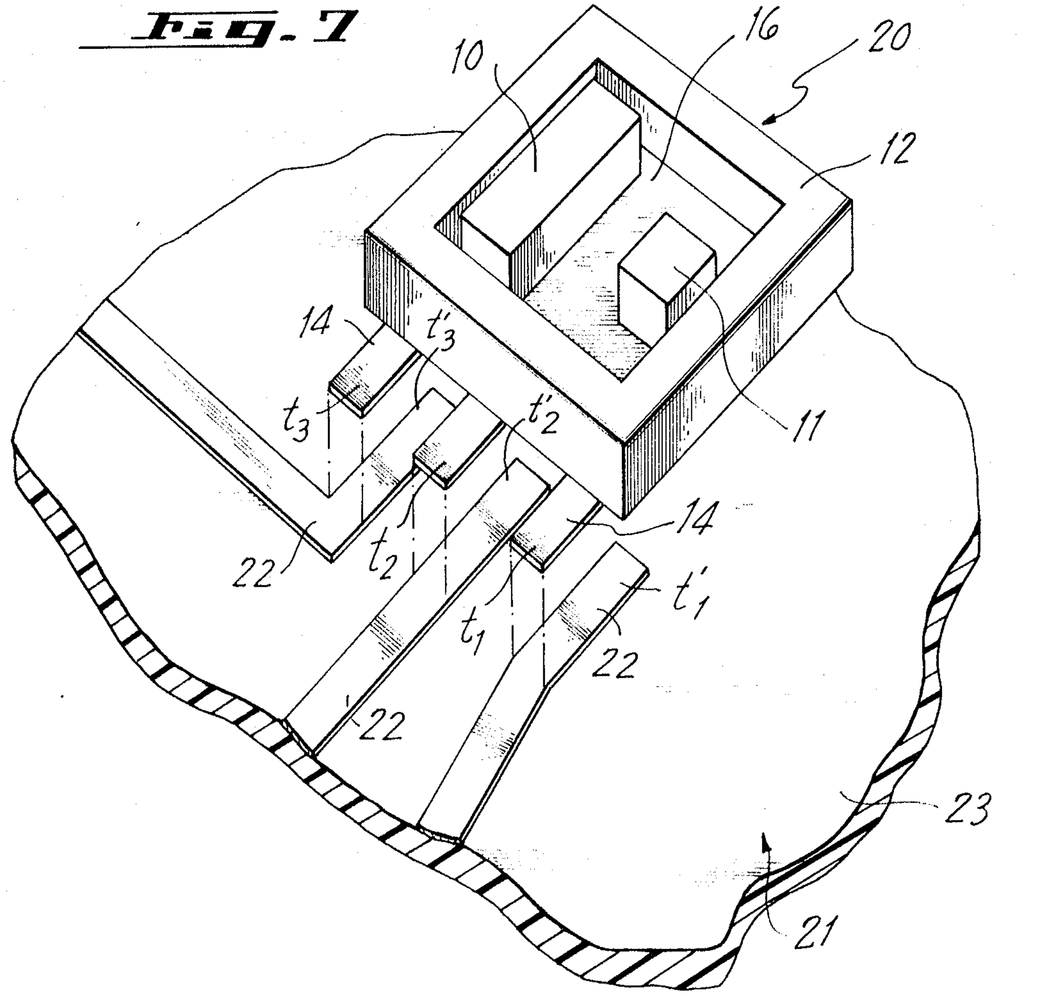

FIGS. 4A, B and C are sectional views similar to that of FIG. 3 and showing successive steps in the manufacture of the device of FIGS. 2 and 3;

FIG. 5 is a diagrammatic view showing the electrical equivalent of the circuit device of FIGS. 2 and 3;

FIGS. 6A and 6B are views similar to that of FIG. 2, but showing two other illustrative embodiments of the invention; and FIG. 7 is a schematic perspective view illustrating the manner in which the integrated circuit device of FIG. 2 may be connected to external circuits.

Figure 1:
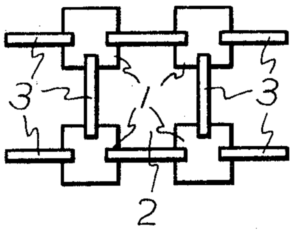
FIG. 1 is an enlarged, schematic plan view of an existing type of integrated circuit device in which insulation of circuit elements is effected by air isolation.

In order to facilitate understanding of this invention, there will first be described herein an integrated circuit device produced by the air isolation method heretofore employed in the art, and which is illustrated in FIG. 1. In such existing device, the circuit elements 1 are electrically isolated from each other by spaces 2 and are electrically connected and mechanically coupled with each other by means of beam leads 3 which span the spaces 2 in a predetermined pattern. In producing a device as shown on FIG. 1, it is the practice in the prior art to form the circuit elements 1 on a common semiconductor substrate; to provide the beam leads 3 on the substrate for the electrical connection of the circuit elements 1 in a predetermined pattern; and then to remove the semiconductor portions between the circuit elements 1 which are to be isolated from the others so as to provide the voids or spaces 2 therebetween. However, the beam leads 3 are formed by means of plating, vapor deposition or the like so as to facilitate the production thereof, which results in such leads being small in thickness and hence of relatively poor rigidity. By reason of the foregoing, the beam leads 3 are likely to be broken during subsequent manufacturing operations, transportion or the like which require handling of the completed integrated circuit device. Consequently, much skill and care has to be exercised in handling the integrated circuit device after the formation of the voids or spaces, and this results in the lowering of the operation efficiency throughout the subsequent manufacturing processes.

Wherever the term "circuit element" is referred to in this specification, such term is intended to mean a single semiconductor element, a compound semiconductor element or an integrated circuit element.

Referring now to FIGS. 2 and 3, it will be seen that the reference numeral 20 there indicates generally a device produced according to one embodiment of this invention. The integrated circuit device 20, as shown, comprises three transistors $Tr_1$, $Tr_2$ and $Tr_3$ having their collectors, bases and emitters interconnected, a diode D connected at one end to the bases of the transistors $Tr_1$, $Tr_2$ and $Tr_3$ and a resistor R connected to the other end of the diode D, so as to form the equivalent of the circuit diagrammatically illustrated on FIG. 5.

In the device 20, a semiconductor block 10 having formed thereon the transistors $Tr_1$, $Tr_2$ and $Tr_3$ and a semiconductor block 11 with the diode D mounted thereon are provided in spaced relation to each other within a space 2 which is enclosed and defined by a square semiconductor frame 12 which is similarly in spaced relation to the semiconductor blocks 10 and 11, as depicted in FIGS. 2 and 3. The transistors $Tr_1$, $Tr_2$ and $Tr_3$ are formed with their collectors $C_1$, $C_2$ and $C_3$ in common, with their bases $B_1$, $B_2$ and $B_3$ independently mounted on the collectors and with their emitter $E_1$, $E_2$ and $E_3$ provided on the respective bases, as clearly shown in FIG. 3.

Further, the semiconductor frame 12 has formed therein the resistor R consisting of, for example, a diffusion region. The transistors $Tr_1$, $Tr_2$ and $Tr_3$, the diode D and the resistor R are interconnected by means of beam-shaped conductive layers, that is, beam leads 13, for internal connections in a predetermined pattern, such as is shown in FIG. 5. In addition, beam leads 14 for connections with external circuits are formed on the semiconductor frame 12, preferably simultaneously with the formation of beam leads 13, so as to be secured at one end to frame 12 and to project therefrom for providing terminals $t_1$, $t_2$ and $t_3$.

In the illustrated example, where the resistor R is connected at one end to the terminal $t_1$ and the collectors and emitters of the transistors $Tr_1$, $Tr_2$ and $Tr_3$ are respectively connected to the common terminals $t_2$ and $t_3$, the beam leads 14 corresponding to the terminals are provided in such a manner that they are mechanically coupled with the semiconductor frame 12 and in some cases also with the block 10 and project outwardly from the frame, as shown on FIG. 2.

The semiconductor block 10 having the circuit elements for example, the transistors $Tr_1$, $Tr_2$ and $Tr_3$, the semiconductor block 11 having the diode D and the semiconductor frame 12 are preferably all formed of the same semiconductor material, and further the frame 12 is of sufficient mechanical strength so as to be capable of being picked up without damage thereto. This is an important advantage of the integrated circuit devices according to this invention.

A method of making an integrated circuit device according to this invention, for example, as shown in FIGS. 2 and 3, will now be described in connection with FIG. 4. The first step is to provide a semiconductor substrate 15 of silicon or the like which is, for example, of N-type conductivity. Then, an impurity of P-type conductivity, that is, of conductivity opposite to that of the semiconductor substrate 15, is diffused into the substrate 15 from its upper surface 15*a* at selected areas to form therein the bases $B_1$, $B_2$ and $B_3$ of the transistors $Tr_1$, $Tr_2$ and $Tr_3$, the diode D and the resistor R. Following this, an impurity of N-type conductivity opposite to that of the bases $B_1$, $B_2$ and $B_3$ is diffused into the bases at selected areas to form therein the emitters $E_1$, $E_2$ and $E_3$ of the transistors $Tr_1$, $Tr_2$ and $Tr_3$, as illustrated in FIG. 4A. An insulating layer 16 of silicon dioxide is then applied over surface 15 *a* for shielding the junctions from the outside after formation of the circuit elements.

Openings are formed in layer 16 so that the latter functions as a mask during the formation of electrodes 17 on the circuit elements, namely, the transistors $Tr_1$, $Tr_2$ and $Tr_3$, the diode D and the resistor R by means of vapor deposition. Then, the electrodes 17 are interconnected by forming an insulating layer 16 the beam-like conductive layers or beam leads 13 serving as internal connections, and the beam leads 14 for connections with external circuits are formed over layer 16, as shown in FIG. 4B. The formation of the beam leads 13 and 14 may take place simultaneously by sequential plating, vapor deposition or the like of titanium and gold.

Simultaneously with, or independent of the formation of the beam leads 13, the leads 14 serving as terminals for connections with external circuits are connected with the beam leads 13 at the required positions.

Thereafter, the semiconductor substrate 15 is subjected to, for example, selective etching from its underside 15*b* to remove selected portions thereof, as indicated at 18, to provide a semiconductor block 10 having the transistors $Tr_1$, $Tr_2$ and $Tr_3$, another semiconductor block 11 having the diode D and a semiconductor frame 12 having the resistor R, thus achieving air-isolation of the circuit elements from each other, as shown on FIG. 4C.

In this manner there is provided the desired integrated circuit device 20 which comprises the semiconductor block 10 having formed thereon the transistors $Tr_1$, $Tr_2$ and $Tr_3$ in spaced relation, the semiconductor block 11 having formed thereon the diode D, and the semiconductor frame 12 having the resistor R and which is in surrounding but spaced relation to the blocks 10 and 11, and in which the blocks 10 and 11 and the frame 12 are electrically and mechanically coupled together by means of the leads 13 and 14, with such leads being insulated from each other, except at their points of connection, by means of the underlying layer 16.

With the foregoing arrangement, the frame 12 and blocks 10 and 11 may be formed simultaneously of the same semiconductor material so that the number of manufacturing operations is not increased and such operations can be easily performed. Further, the integrated circuit device thus produced is provided with the frame 12 surrounding the major portion of the device and such frame is of sufficient mechanical strength so that the device can be picked up or otherwise handled at its frame without damage thereto. This ensures easy handling of the device and requires much less skill and care than in the case of the prior art device previously described with reference to FIG. 1. Thus, the manufacture of components including integrated circuit devices according to this invention can be performed with increased efficiency. In addition, the thickness of the beam leads 13 and 14 can be reduced as compared with the thickness of the leads of the prior art device and hence the manufacture of the device can be simplified.

In the foregoing example, one resistor R acting as a circuit element is mounted on frame 12, but it is to be noted that a plurality of resistors or other active or passive circuit elements may be formed on the frame 12, or, if desired, all of the active circuit elements may be formed on blocks within the space defined by the frame, in which case no circuit elements appear on the frame.

While the invention has been described in connection with an embodiment in which two semiconductor blocks having circuit elements therein are disposed within frame 12, it will be understood that more than two blocks carrying circuit elements can be provided within frame 12 and coupled together by beam leads 13, or that the circuit elements desired to be isolated can be formed on a single block and the frame 12.

The embodiment described above with reference to FIGS. 2 and 3 employs a one-piece frame 12, but such frame may be formed by assembling together a plurality of frame members. Further, the frame 12 may be endless, for example, in the form of a square, as shown on FIG. 2, or substantially U-shaped or horseshoe-shaped, as shown at 12*a* on FIG. 6A, or H-shaped, as shown at 12*b* on FIG. 6B. In the case of the H-shaped frame 12*b*, such frame can be formed by assembling together two U-shaped frames in back to back relation.

It will be apparent that the frames 12*a* and 12*b* substantially enclose a single space 2*a* and two spaces 2*b* and 2'*b*, respectively, which accommodate the semiconductor blocks 21*a* and the semiconductor blocks 21*b* and 21'*b*. As before, such semiconductor blocks are spaced from the respective frames and from each other for air isolation of the respective circuit elements. Such circuit elements are electrically interconnected by beam leads 13*a* (FIG. 6A) and 13*b* (FIG. 6B) which also function to mechanically couple the semiconductor blocks to the surrounding semiconductor frames, and leads 14*a* (FIG. 6A) and 14*b* (FIG. 6B) extend from the respective frames 12*a* and 12*b* for connection of the integrated circuits to external circuits.

It will be apparent that, in all of the above described embodiments of the invention, the beam leads 13 and 14, 13*a* and 14*a*, or 13*b* and 14*b* are substantially coplanar and constitute the highest elevations on the respective integrated circuit device, that is, no portions of the device 20 extend further from the surface thereof having the insulating layer 16 thereon than the beam leads 13 and 14, as shown on FIG. 3. By reason of the foregoing, and as shown on FIG. 7 with respect to the integrated circuit device 20 of FIGS. 2 and 3, devices according to this invention can be conveniently connected with external circuits. For example, as shown, the external circuits for connection to the integrated circuit device 20 may be constituted by a printed circuit board 21 having conductive areas 22 on an insulating substrate 23. The conductive areas 22 have terminal portions $t'_1$, $t'_2$ and $t'_3$ located to register with terminals $t_1$, $t_2$ and $t_3$, respectively, of integrated circuit device 20 when the latter is disposed on board 21 with the plane of beam leads 13 and 14 facing toward the printed circuit board. Since beam leads 13 and 14 constitute the highest elevations on device 20, there is no impediment or obstacle to the facial contact of terminals $t_1$, $t_2$ and $t_3$ with terminal portions $t'_1$, $t'_2$ and $t'_3$ when the device 20 is placed on board 21. With the respective terminals of device 20 and board 21 thus disposed in facial contact with each other, such terminals can be easily and simultaneously bonded to each other, for example, by the application of pressure and heat or ultrasonic welding techniques, or as described in U.S. Pat. No. 3,452,917 and U.S. Pat. No. 3,475,810.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An integrated circuit device consisting of at least two members of the same semiconductor material, at least one of said members forming a frame for said device and defining at least one space which is substantially enclosed by said frame, at least another of said members being in the form of a block situated in said space and spaced from said frame, circuit elements formed in at least each said block, a continuous insulating layer covering a surface of each of said members and spanning the spacing between said frame and each said block, said insulating layer having an opening at each of said circuit elements, and conductive beam leads superposed on said insulating layer and connected with said circuit elements at said openings in the insulating layer, at least some of said beam leads spanning said spacing between said frame and each said block and constituting, with said insulating layer, the sole means by which each said block is mounted within said frame, at least some of said beam leads projecting beyond the outer periphery of said frame, said beam leads being all substantially coplanar with each other and constituting the highest elevations on the integrated circuit device from said surface of said members for convenience in bonding said beam leads which project beyond the frame to conductive areas on a substrate which define external circuits.

2. An integrated circuit device according to claim 1, in which at least one of said circuit elements is formed in said frame.

3. An integrated circuit device according to claim 1, in which a plurality of said members are in said block form.

4. An integrated circuit device according to claim 1, in which said frame is endless to completely enclose said space.

5. An integrated circuit device according to claim 1, in which said frame is U-shaped to enclose said space on three sides.

6. An integrated circuit device according to claim 1, in which said frame is H-shaped to define a space in addition to said one space, and in which a plurality of said members are in said block form with at least one member in block form being situated in each said space.

7. The combination of a substrate having conductive areas on a surface thereof to define external circuits; and at least one integrated circuit device mounted on said substrate and connected with said external circuits, said integrated circuit device consisting of at least two members of the same semiconductor material, at least one of said members forming a frame for said device and defining at least one space which is substantially enclosed by said frame, at least another of said members being in the form of a block situated in said space and spaced from said frame, circuit elements formed in at least each said block, a continuous insulating layer covering a surface of each of said members and spanning the spacing between said frame and each said block, said insulating layer having an opening at each of said circuit elements, and conductive beam leads superposed on said insulating layer and connected with said circuit elements at said openings in the insulating layer, at least some of said beam leads spanning said spacing between said frame and each said block and constituting, with said insulating layer, the sole means by which each said block is mounted within said frame, at least some of said beam leads projecting beyond the outer periphery of said frame, said beam leads being all substantially coplanar with each other and constituting the highest elevations on the integrated circuit device from said surface of said members, said integrated circuit device being disposed against said substrate with said beam leads facing towards said surface of the substrate with said beam leads which project beyond the frame being facially contacted with, and bonded to respective portions of said conductive areas for the connection to said external circuits.

* * * * *